(12) United States Patent
Liu

(10) Patent No.: US 7,742,311 B2
(45) Date of Patent: Jun. 22, 2010

(54) DAMAGE PREVENTION INTERPOSER FOR ELECTRONIC PACKAGE AND ELECTRONIC INTERCONNECT STRUCTURE

(75) Inventor: Weifeng Liu, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 406 days.

(21) Appl. No.: 11/735,067

(22) Filed: Apr. 13, 2007

(65) Prior Publication Data

US 2008/0253098 A1    Oct. 16, 2008

(51) Int. Cl.
*H01R 9/00* (2006.01)
(52) U.S. Cl. .................. 361/774; 361/760
(58) Field of Classification Search ............. 361/774, 361/771, 767, 760; 174/257, 258, 259; 438/106; 257/E21.511

See application file for complete search history.

(56) References Cited

U.S. PATENT DOCUMENTS

| | | | |
|---|---|---|---|
| 5,796,590 A | * | 8/1998 | Klein .................. 361/774 |
| 6,188,131 B1 | * | 2/2001 | Nereng .................. 257/718 |
| 6,556,455 B2 | * | 4/2003 | Dibene et al. .......... 361/785 |
| 6,660,563 B1 | | 12/2003 | Cromwell |
| 6,791,184 B2 | | 9/2004 | Deeney |
| 6,998,539 B2 | * | 2/2006 | Andrews et al. ........ 174/259 |
| 7,196,907 B2 | * | 3/2007 | Zheng .................. 361/760 |

* cited by examiner

*Primary Examiner*—Jeremy C Norris
*Assistant Examiner*—Yuriy Semenenko

(57) ABSTRACT

An assembly. The assembly reduces damage to a related electronic package during attachment to a related electronic interconnect structure. The assembly includes an interposer. The interposer has a first side and an opposing second side and has multiple holes formed in the interposer that extend from the first side to the second side. The electronic package is configurable to comprise one or more electronic structures; the interposer is configured for placement between the electronic package and the electronic interconnect structure; the locus of a wall of each of the holes is configured to facilitate insertion of a matching coupling component configured for electrically coupling the electronic package to the electronic interconnect structure; the wall of each hole is configured to provide complete encirclement of that hole; and the interposer mechanically inhibits physical contact between the electronic package and the electronic interconnect structure.

16 Claims, 8 Drawing Sheets

DAMAGE PREVENTION INTERPOSER FOR ELECTRONIC PACKAGE AND ELECTRONIC INTERCONNECT STRUCTURE

BACKGROUND

A number of different types of electronic packages are used to mount integrated circuits and other electronic devices. Such packages are used because they often provide the advantages of physical protection, electrical interconnect, and thermal dissipation for the mounted device. However, thermal fatigue, solder ball creep under compression loading, and other related issues are items of concern due to thermal stresses resultant from variations in thermal coefficients between the various components of the package and its mounted device(s) and due to the nature by which these completed packages are assembled. This is especially the case for the larger area packages.

In order to reduce the risk of a failure in the package, mechanical stops or interposers have been included to provide some support to the package substrate. These designs typically use metal or plastic spacers inserted under the package corners or edges. Since ceramic substrates have a high mechanical strength and can usually withstand the high stresses exerted on the package corners and edges, they may be relatively effective for ceramic packages. However, for other types, such as laminate packages, the substrates cannot withstand the high stresses typically involved in the assembly process. A large mechanical load on the package can easily break the laminate substrate at its corners or edges or can result in excessive warp of the substrate.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. In these drawings, like reference numerals identify corresponding elements.

DETAILED DESCRIPTION

Figure 1:
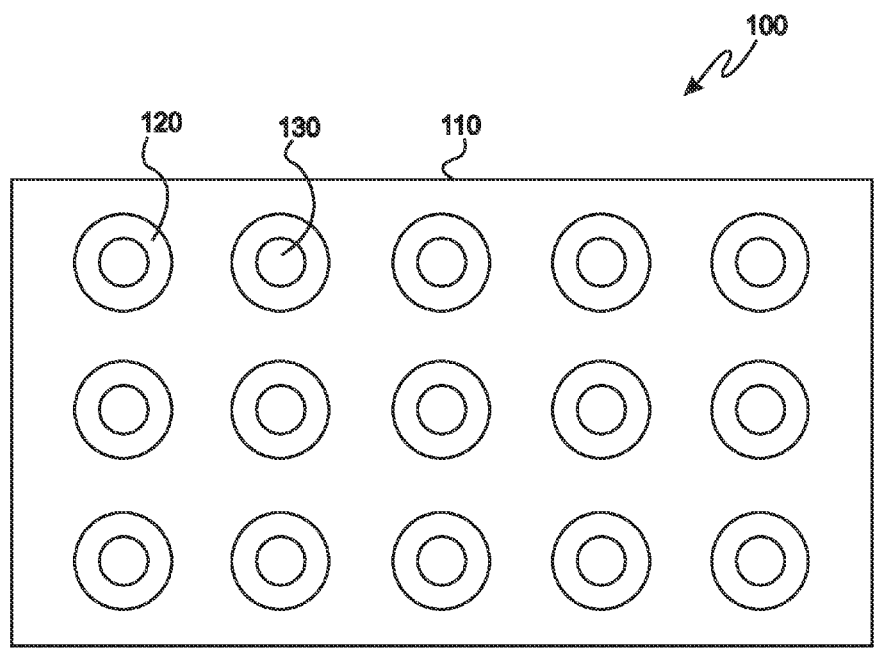
FIG. 1 is a drawing of a top view of an assembly as described in various representative embodiments.

As shown in the drawings for purposes of illustration, techniques are disclosed herein for an apparatus which can prevent damage to an electronic package during and following attachment to an electronic interconnect structure. The apparatus comprises an interposer that can be placed between the electronic package and the electronic interconnect structure prior to their attachment to each other. The interposer comprises multiple holes that extent through the interposer body. The holes facilitate insertion of coupling components that can electrically couple the electronic package to the interconnect structure. The interposer mechanically inhibits motion and physical contact between the electronic package and the interconnect structure reducing thereby any bending moments present during assembly that could potentially damage the assembly. Previous techniques for providing such protection have relied upon metal or plastic spacers inserted under the package corners or edges. However, breakage and warp are of major concern in assemblies using previous techniques.

In the following detailed description and in the several figures of the drawings, like elements are identified with like reference numerals.

The interposer described herein can be implemented as a full-body mechanical stop for grid array packages, such as ball grid arrays (BGAs) and column grid arrays (CGAs). The ball material can be eutectic tin, lead solder, high lead, lead free, copper, plastic, or other appropriate material. The package can be a ceramic package, a HICTE (High Coefficient of Thermal Expansion) package, laminate package, or other appropriate material. The mechanical stop can be fabricated from the following materials: a plastic, a thermoplastic, a plastic embedded with fibers, a polymer, a liquid crystal polymer, a metal, a metal having an outer dielectric layer, a metal coated with an outer dielectric layer, a metal having an outer plastic layer, a metal plate, a metal plate having an outer dielectric layer, a metal plate coated with an outer dielectric layer, a metal plate having an outer plastic layer, a ceramic, and a composite construct having a metal in a first region and a plastic in a second region.

The mechanical stop can be pre-attached to the bottom of a package substrate with solder balls or columns in the interposer via holes, pre-attached to an electronic interconnect structure, or can function as a separate piece. During assembly, the interposer is sandwiched between a package and an electronic interconnect structure such as a printed circuit board (PCB). The mechanical stop provides enhanced protection to the delicate array packages and solder joints under mechanical loading conditions by distributing the mechanical load more evenly across the package both during assembly and after. It can provide other benefits as well, such as minimizing printed circuit board and package warp, providing improved shock and vibration resistance, enabling hardware design and assembly flexibility, and minimizing solder ball shorting.

FIG. 1 is a drawing of a top view of an assembly 100 as described in various representative embodiments. In FIG. 1, the assembly 100 comprises an interposer 110 having multiple holes 120 of which for ease and clarity of illustration only one is labeled and a coupling component 130 extending through each hole 120. Again for ease and clarity of illustration, only one coupling component 130 is labeled.

Figure 2:
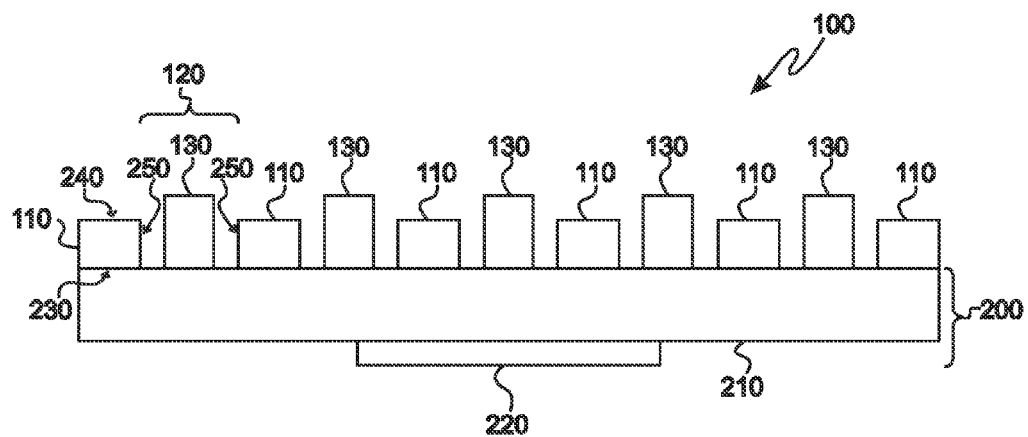
FIG. 2 is a drawing of a side view of the assembly of FIG. 1.

FIG. 2 is a drawing of a side view of the assembly 100 of FIG. 1. As can be seen from FIG. 2, the assembly further comprises an electronic package 200 at least part of which is shown in FIG. 2. The electronic package 200 comprises a substrate 210 on which substrate 210 an electronic structure 220 is mounted. The electronic structure 220 could be an electronic component 220, a monolithic chip 220, a die 220, an electronic circuit 220 such as an integrated circuit 220, or other appropriate item. The electronic package 200 could further comprise multiple electronic structures 220 mounted on the substrate 210 and could further comprise other items as, for example, a heatsink which will be shown in subsequent figures and discussed therewith. The holes 120 are formed in the interposer 110 from a first side 230 to a second side 240 of the interposer 110. The hole 120 has a wall 250 which for ease and clarity of illustration is only shown for one hole 120 in FIG. 2. The electronic package 200 could be a ball grid array 200, a plastic ball grid array 200, a column grid array 200, a chip scale package 200, or a ceramic package 200.

Figure 3:
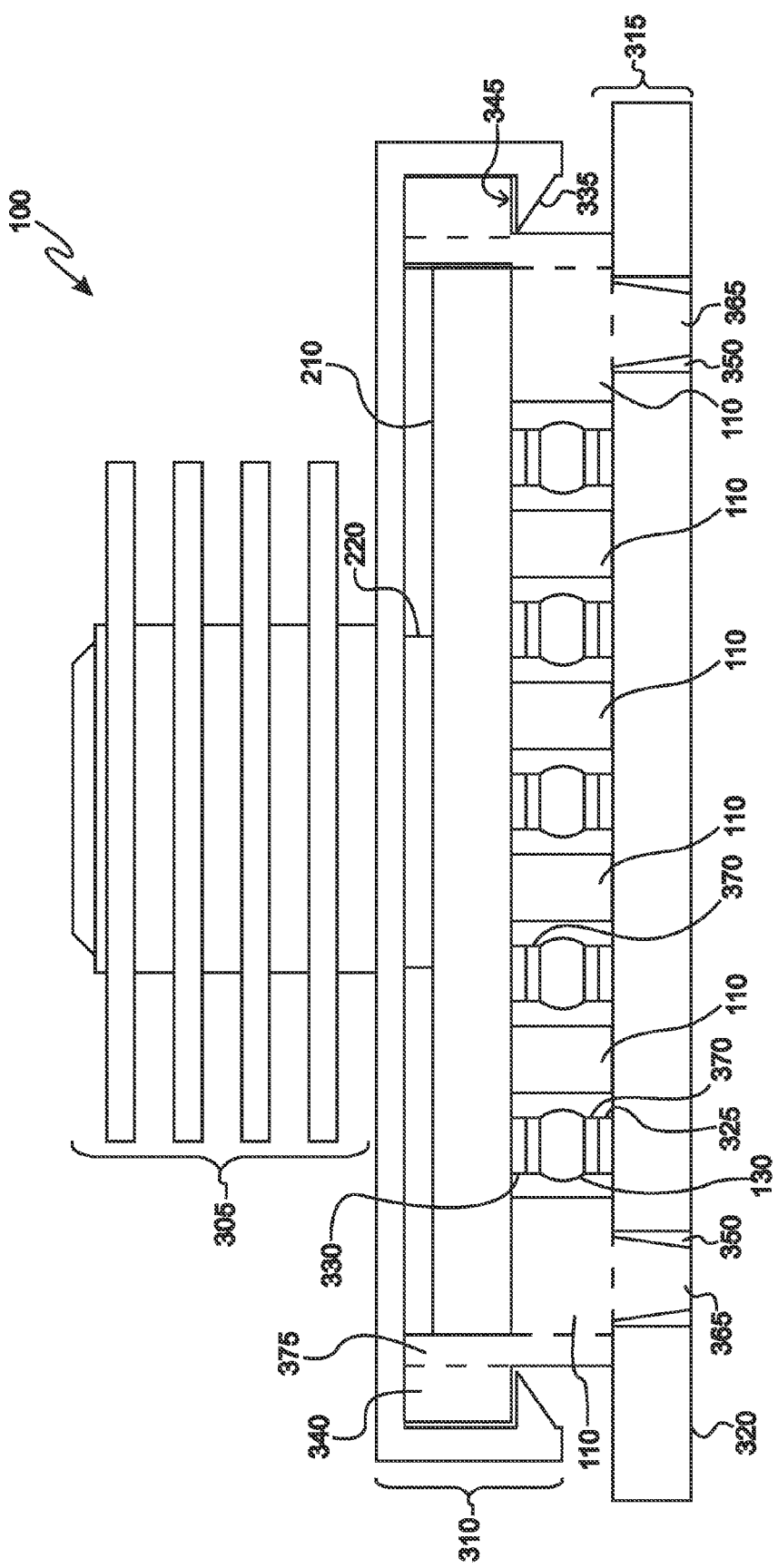
FIG. 3 is a drawing of another assembly as described in various representative embodiments.

FIG. 3 is a drawing of another assembly 100 as described in various representative embodiments. In FIG. 3, the assembly 100 comprises a heatsink 305, the electronic package 200, a heatsink attachment device 310, the interposer 110, the coupling components 130, and the electronic interconnect structure 315. The electronic package 200 comprises the electronic component 220 and the substrate 210 but is not specifically identified in FIG. 3.

The electronic interconnect structure 315 comprises an interconnect base 320 and interconnect traces 325, only one of which is so identified in FIG. 3 for ease and clarity of illustration. The electronic interconnect structure 315 can have alignment openings 350 to aid in aligning the interposer 110 to the electronic interconnect structure 315. The electronic interconnect structure 315 could be fabricated as a printed circuit board 315, an organic-based printed circuit board 315, a thick-film ceramic substrate structure 315, a cofired ceramic substrate structure 315, thin-film multilayer substrate 315, or the like. Interconnect traces 325, only one of which is so identified in FIG. 3 for ease and clarity of illustration, on the electronic interconnect structure 315 could be metallic traces attached, patterned, and etched on the interconnect base 320 using standard printed circuit board processing methods.

In this representative embodiment, the interposer 110 comprises an alignment frame 375, a heatsink stop 340, and alignment pins 365. The alignment frame 375 is configured for aligning the electronic package 200 to the interposer 110. The alignment frame 375, the heatsink stop 340, and the alignment pins 365 are shown separated from the other part of the interposer 110 by dotted lines since they can be either fabricated as an integral part of the interposer 110 or fabricated separately and then attached to the interposer 110. The interposer 110 can also have a clip latch attachment surface 345, only one of which is so identified in FIG. 3 for ease and clarity of illustration. The alignment pins 365 on the interposer 110 mate with the alignment openings 350 on the electronic interconnect structure 315 to facilitate alignment of the interposer 110 to the electronic interconnect structure 315.

In addition to the electronic structure 220 and the substrate 210, the electronic package 200 further comprises package conductors 330, only one of which is so identified in FIG. 3 for ease and clarity of illustration. The package conductors 330 could be electrically coupled to the interconnect traces 325 via the coupling components 130 which in FIG. 3 are solder balls 130 that have been reflowed in order to make good electrical contact to both the interconnect traces 325 and the coupling components 130. Prior to reflow of the solder balls 130, the interconnect traces 325 and the coupling components 130 could be coated with a layer of solder which is not shown in FIG. 3 as it would have coalesced with the solder balls 130 when the solder was reflowed.

The heatsink attachment device 310 comprises a clip structure 335 and is attached to the heatsink 305. The heatsink 305 is shown in FIG. 3 as heatpipe 305. The heatsink 305 could comprise aluminum or other metal fins to dissipate the heat generated by the electronic component 220. The heatsink attachment device 310 thermally couples the heatsink 305 to the electronic component 220. By forcing the clip structure 335 over a heatsink stop 340 on the interposer 110. The heatsink 305 is coupled thermally to the electronic component 220 by forcing the clip structure 335 over the heatsink stop 340 and against the clip latch attachment surface 345.

In a representative embodiment, the apparatus 100 disclosed herein comprises an electronic package 200, which could be a grid array package, and the interposer 110. The interposer 110 can be permanently attached to the bottom of the substrate of the electronic package 200 through a variety of methods, such as epoxy adhesive. The interposer 110 can also be maintained as a separate unit until the final assembly of the electronic package 200, the interposer 110, and the electronic interconnect structure 315 at which time it is inserted under the electronic package 200 just prior to, for example, a surface-mount technology (SMT) process.

In an alternative representative embodiment, the apparatus disclosed herein comprises electronic interconnect structure 315, which could be a printed circuit board 315 or other appropriate interconnect structure, and the interposer 110. The interposer 110 can be permanently attached to the top of the electronic interconnect structure 315 through a variety of methods, such as epoxy adhesive.

Should the interposer 110 be fabricated from a conducting material such as a metal, the conducting material could be coated with a plastic or other non-conducting material to prevent shorting the interposer 110 out with the solder joints. Multiple holes 120 or cavities 120 are formed in the interposer 110 which extend from the first side 230 of the interposer 110 to the second side 240 of the interposer 110. The locus of the wall 250 of each of the holes 120 is configured to facilitate insertion of a matching coupling component 130 configured for electrically coupling the electronic package 200 to the electronic interconnect structure 315. The holes 120 can be round, square, or other configuration as appropriate and correspond to the locations of solder balls or columns which will connect electrical coupling elements on the electronic package 200 to electrical coupling elements on the electronic interconnect structure. The diameter of each of the holes 120 should be appropriately larger than that of solder balls or columns, so there is sufficient clearance between the coupling component (i.e., the solder ball or column) and the wall 250 of the hole 120 after reflow of the solder. The interposer height should be designed to satisfy a solder ball collapse requirement.

When assembled on the electronic interconnect structure 315 (the printed circuit board 315), the interposer 110 will be sandwiched between electronic interconnect structure 315 and the substrate 210 of the electronic package 200. The interposer 110 can be sandwiched either tightly or with a certain gap between the electronic interconnect structure 315 and the electronic package 200 based on the needs of the design. The interposer 110 can be used with various area array packages, with either ball grid array or column grid array packages, with tin-led solder ball, high lead solder balls or lead free solder balls, with small scale packages like chip scale packages (CSPs), or large scale packages such as ceramic packages with tens of thousands I/O. In another implementation, the interposer 110 can be made as a part of a printed circuit board. Via holes are drilled into the multilayer printed circuit board. Then the interposer is attached to the package substrate and solder balls or columns are assembled on the substrate through reflow.

Other features such as the heatsink stop 340, which provides a mechanical stop for the attachment of a heatsink 305, can also be designed into the structure of the interposer 110. The heatsink stop 340 can provide useful protection for electronic components 220 such as monolithic chips 220 for lidless electronic packages 200 by reducing the movement of a heatsink 305 during assembly and afterwards. The heatsink stop 340 is configured to restrict the force applied to the electronic package 200 from a heatsink 305 attachment to the electronic package 200. At the perimeter region, the interposer 110 can also comprise mechanisms to enable the clipping of a heatsink 305 to the interposer 110. For this embodiment, the heatsink 305 does not need to be clamped to the printed circuit board 315. In such cases, bulky metal bolsters can be eliminated without excessive warp of the printed circuit board 315. The clip structure 335 can be fabricated from metal, plastic, or other appropriate material. For heavy heatsinks 305 a high strength material will be needed for the interposer 110. The interposer 110 can also have alignment features, such as alignment pins 365 at, for example, two diagonal corners or an alignment frame 375 at the perimeter which is similar to a socket design. Such alignment features can facilitate an accurate placement of the electronic package 200 on the electronic interconnect structure 315. Without the use of x-ray equipment, an operator can accurately place the electronic package 200. If the interposer 110 is a separate unit, it can be placed on the electronic interconnect structure 315 first. Then the electronic package 200 can be placed on the interposer 110 with the solder balls 130 falling into the interposer 110 holes 120.

Injection molding can be used to fabricate a plastic interposer 110. If the electronic interconnect structure 315 is a printed circuit board, round holes can be created in the drill process. For metal interposers 110, a process similar to stencil fabrication can be employed which could use an electrochemical process, a laser, or other appropriate process and apply a layer of insulation. For ceramic interposers 110, holes 120 can be created prior to sintering. Various options are available for creating the assembly 100. In particular, in attaching the interposer to the substrate 210 of the electronic package 200, the solder balls 130 could be attached to the substrate 210 of the electronic package 200 using a reflow process, then epoxy could be pre-applied to the substrate, the interposer 110 attached to the substrate, and then the epoxy cured. As an alternative, solder paste is applied first, the interposer 110 is attached, and then the interposer 110 is used in the placement of the solder balls 130 or solder columns 130, and finally the solder is reflowed. As another option, the interposer 110 can be attached to the electronic interconnect structure 315 first, the electronic package 200 placed onto the interposer 110, and then the sandwiched assembly 100 passes through a solder reflow process.

In a representative embodiment, the interposer 110 can be pre-attached to the bottom of substrate 210 of the electronic package 200 using adhesives such as epoxy. The interposer 110 can be attached prior to ball attach, or after ball attach. For the former case, the cavities 120 of the interposer 110 can facilitate the placement of the solder balls 130 on the substrate 210 before solder reflow. The interposer 110 can also serve as a "stencil" for applying solder paste, the solder paste can also be placed via a dispensing process.

In another representative embodiment, the interposer 110 could be created as a part of the substrate 210 build up. Using the same material as the substrate, arrays of holes are punched out and then stacked together with the substrate. For this embodiment, the cavities of the interposer 110 can facilitate solder ball 130 placement on the substrate 210. The solder balls 130 can readily fall into the cavities 120. The interposer 110 can serve as a "stencil" for applying the solder paste. The solder paste can also be place in the cavities 140 via a dispensing process.

Figure 4:
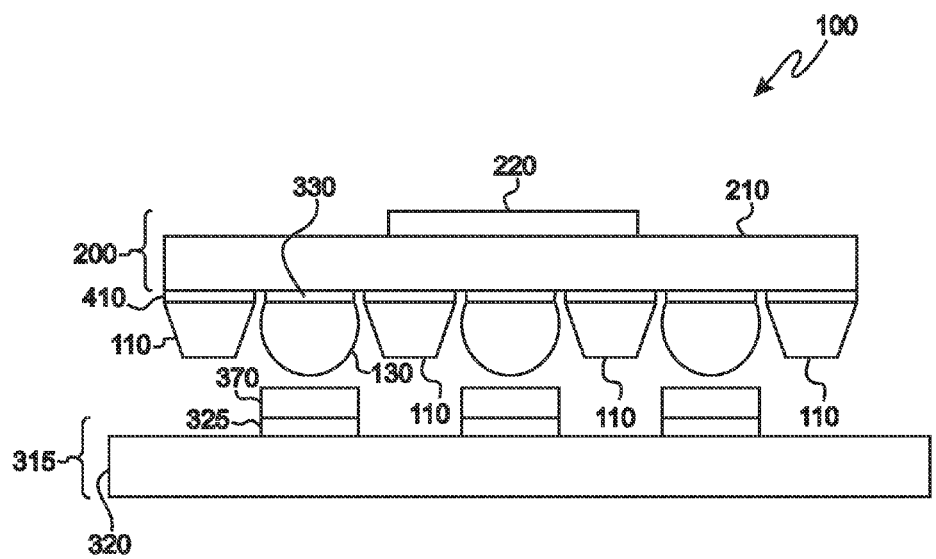
FIG. 4 is a drawing of still another assembly as described in various representative embodiments.

FIG. 4 is a drawing of still another assembly 100 as described in various representative embodiments. In FIG. 4, the electronic component 220 is attached to the substrate 210; adhesive 410 is used to adhere the interposer 110 to the substrate 210; and solder balls 130 are attached to the package conductors 330 on the substrate 210. Interconnect traces 325 on the interconnect base 320 of the electronic interconnect structure 315 are coated with solder paste 370 in preparation for contact with the solder balls 130 and subsequent solder reflow process. Although not shown in FIG. 4, solder paste could also coat the package conductors 330. For ease and clarity of illustration, coupling components 130, interconnect traces 325, package conductors 330, solder paste 370, and adhesive 410 are identified only once in FIG. 4.

Figure 5:
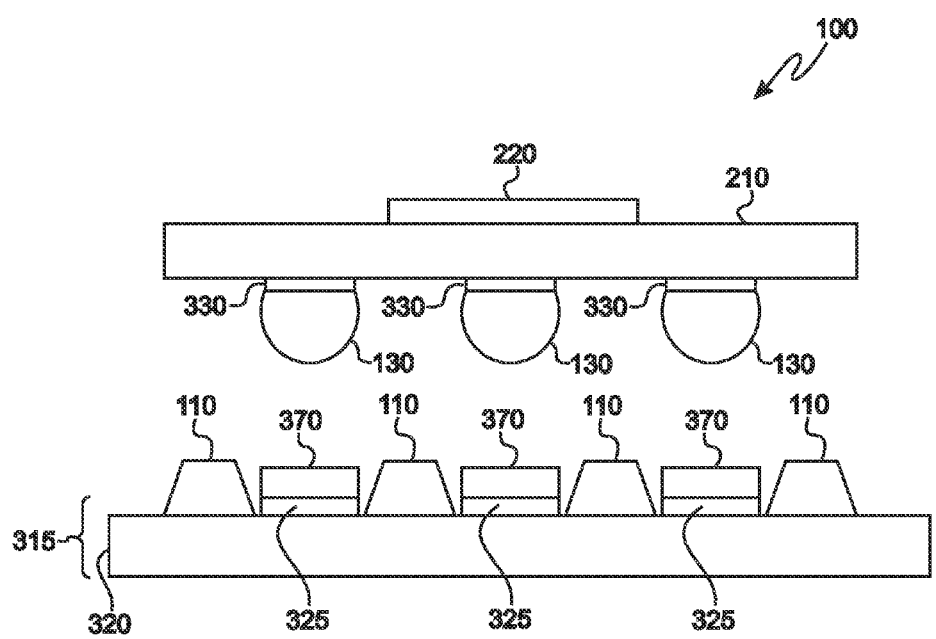
FIG. 5 is a drawing of yet another assembly as described in various representative embodiments.

FIG. 5 is a drawing of yet another assembly 100 as described in various representative embodiments. In FIG. 5, the electronic component 220 is attached to the substrate 210, and solder balls 130 are attached to the package conductors 330 on the substrate 210. Interconnect traces 325 on the interconnect base 320 of the electronic interconnect structure 315 are coated with solder paste 370 in preparation for contact with the solder balls 130 and subsequent solder reflow process. The interposer 110 is placed on top of the electronic interconnect structure 315 prior to contact between the solder balls 130 and solder paste 370 on top of the interconnect traces 325. Although not shown in FIG. 5, solder paste 370 could also coat the package conductors 330.

Figure 6:
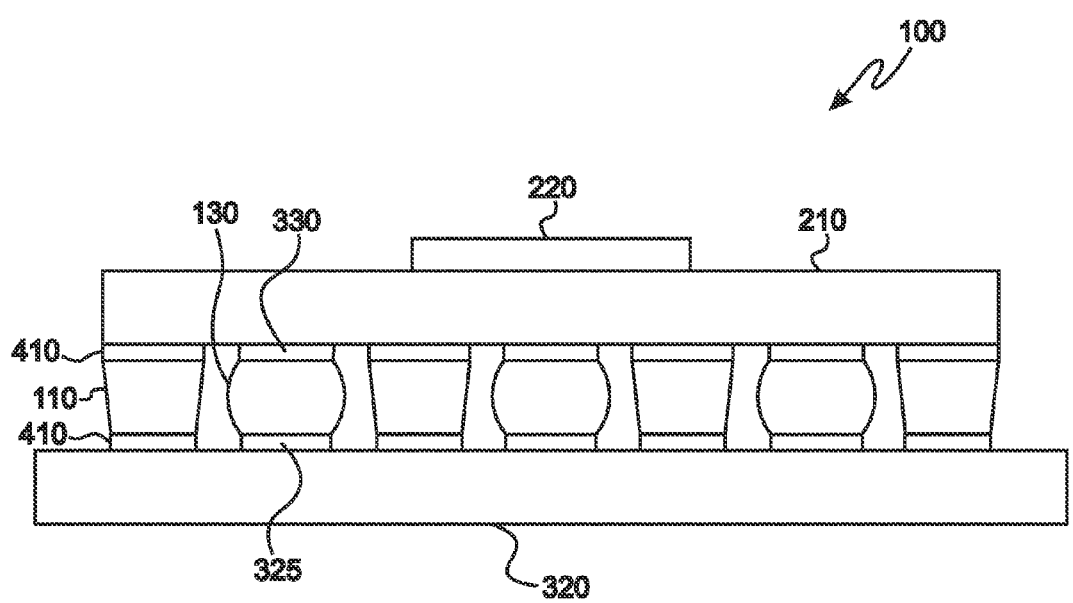
FIG. 6 is a drawing of still yet another assembly as described in various representative embodiments.

FIG. 6 is a drawing of still yet another assembly 100 as described in various representative embodiments. In FIG. 6, a layer of adhesive 410 attaches the interposer 110 to the electronic substrate 210 of the electronic package 200, and a second layer of adhesive 410 attaches the interposer 110 to the electronic interconnect structure 315. In this representative embodiment, the interposer 110 can enhance solder joint reliability by absorbing part of the shear strain resultant from thermal cycling. During thermal cycling as, for example, a change in the ambient temperature between the power on and the power off conditions, the coefficient of thermal expansion between the electronic package 200 substrate 210 and the electronic interconnect structure 315 can cause a shear strain on the solder joints which can result in solder joint cracks and connection opens. If the interposer 110 adheres to both the substrate 210 and the electronic interconnect structure 315, it will share some of the strain on the solder joints and increase solder joint fatigue life. For ease and clarity of illustration, coupling components 130, interconnect traces 325, package conductors 330, the interposer 110, and separate layers of adhesive 410 are identified only once in FIG. 6.

In still another representative embodiment, the interposer 110 can also adhere to electronic interconnect structure 315 and also to the substrate 210 without the use of adhesives. For this embodiment, the interposer 110 can be fabricated from a thermoplastic material which melts at the high reflow temperature but consolidates during cooling. In this case, there will not be any clearance between the solder joints and the interposer 110. The interposer 110 can also be made using thermosetting material and can be cured at high temperatures.

The interposer 110 can also act as a high thermal conductive path by embedding thermally conductive materials in the interposer 110. Such embedded thermally conductive materials could be metal oxide particles, carbon fiber, and the like. Or, a metal plate could be used. However, the metal plate may need to be anodized or coated with an electrically insulating material around the cavities in order to prevent solder joint shorting to the metallic interposer 110.

The interposer 110 can be rigid to provide mechanical support for the electronic package 200 especially under mechanical loading conditions. Alternatively, it can be compliant with its coefficient of thermal expansion tailored to act as a buffer between the electronic package 200 and the electronic interconnect structure 315 which would reduce the impact of thermal mismatch, thereby reducing thermal stresses.

The interposer 110 can be fabricated using traditional socket manufacturing processes such as injection molding. It can also be fabricated using other methods, such as the methods to make paste stencils, among which are laser drilling, chemical etching, electroform, and the like. The interposer 110 can also be fabricated using traditional printed circuit board manufacturing processes such as the drilling of holes 120. The holes 120 can include various shapes such as straight side walls, vertical, tapered, and the like. The printed circuit board conductive pads could be copper plated with nickel/gold, silver, tin-lead, lead free alloy, or other finishes. Solder reflow could be performed by exposing the assembly to a high temperature, such as 220 Degrees C., or 260 Degrees C., for a certain period of time, for example one minute, depending on solder alloy type. At the higher temperatures, the solder paste and solder balls will melt and the package will be soldered permanently to the printed circuit board after cooling.

The interposer 110 can be fabricated from a single piece of material, or from multiple pieces with various additional features on the perimeter of the interposer 110. Such features can be added to the perimeter of the interposer 110 for various purposes such as for attaching a heatsink 305, aligning the electronic package 200 to the interposer 110, or including alignment pins 365.

Figure 7:
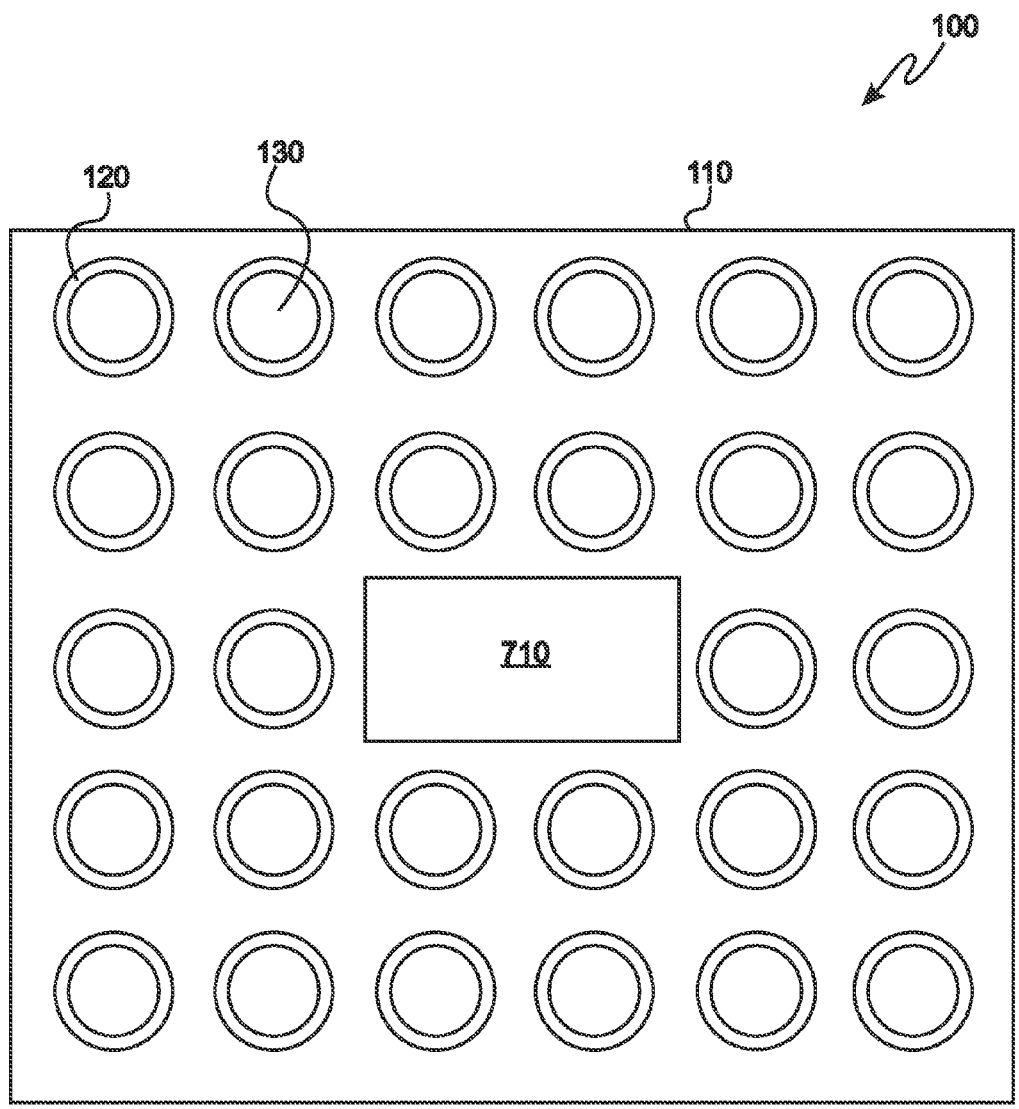
FIG. 7 is a drawing of a top view of even yet another assembly as described in various representative embodiments.

FIG. 7 is a drawing of a top view of even yet another assembly 100 as described in various representative embodiments. In FIG. 7, the assembly 100 comprises an interposer 110 having multiple holes 120, a coupling component 130 extending through each hole 120, and a cut-out 710. Again for ease and clarity of illustration, only one hole 120 and only one coupling component 130 are labeled. In representative embodiments, an interposer 110 may not extend across the full extent of the substrate 210 of the electronic package 200. As an example, for some electronic package 200 designs the bottom of the substrate 210 may not be fully populated with solder balls 130. In this embodiment, the interposer 110 may only cover areas where there are solder balls 130.

Figure 8:
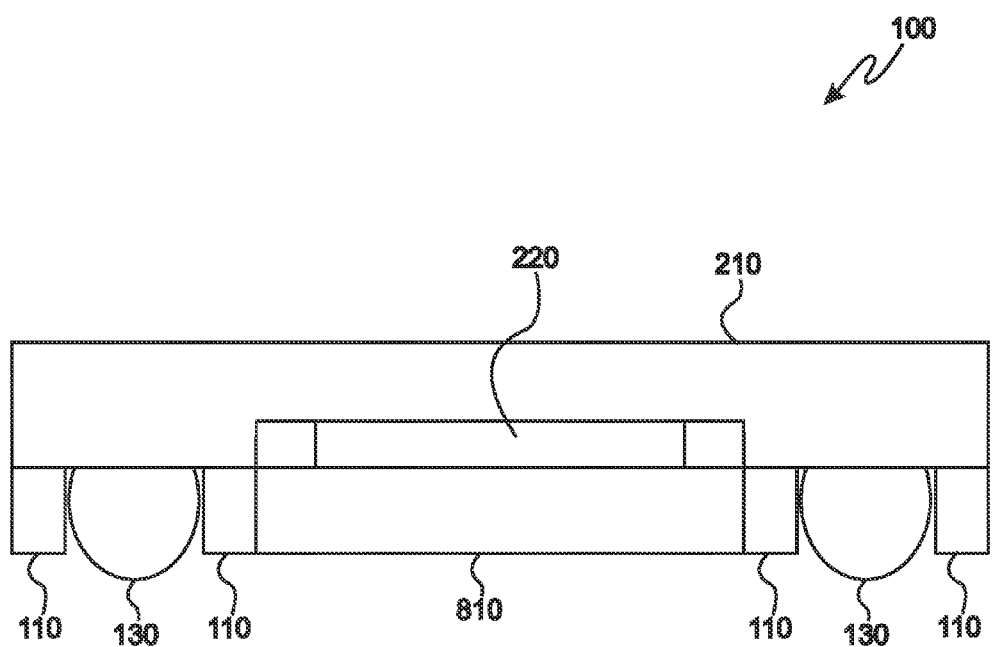
FIG. 8 is a drawing of even still another assembly as described in various representative embodiments.

FIG. 8 is a drawing of even still another assembly 100 as described in various representative embodiments. In FIG. 8, the assembly 100 comprises a substrate 210, an electronic component 220, solder balls 130, the interposer 110, and a thermally conductive plate 810. In this representative embodiment, the electronic component 220 is attached to the bottom of the substrate 210. In this case, a window can be cut out in the central section of the interposer 110. The thermally conductive plate 810 can be embedded in the center of the interposer 110 to enhance thermal conduction from the electronic component 220.

Figure 9:
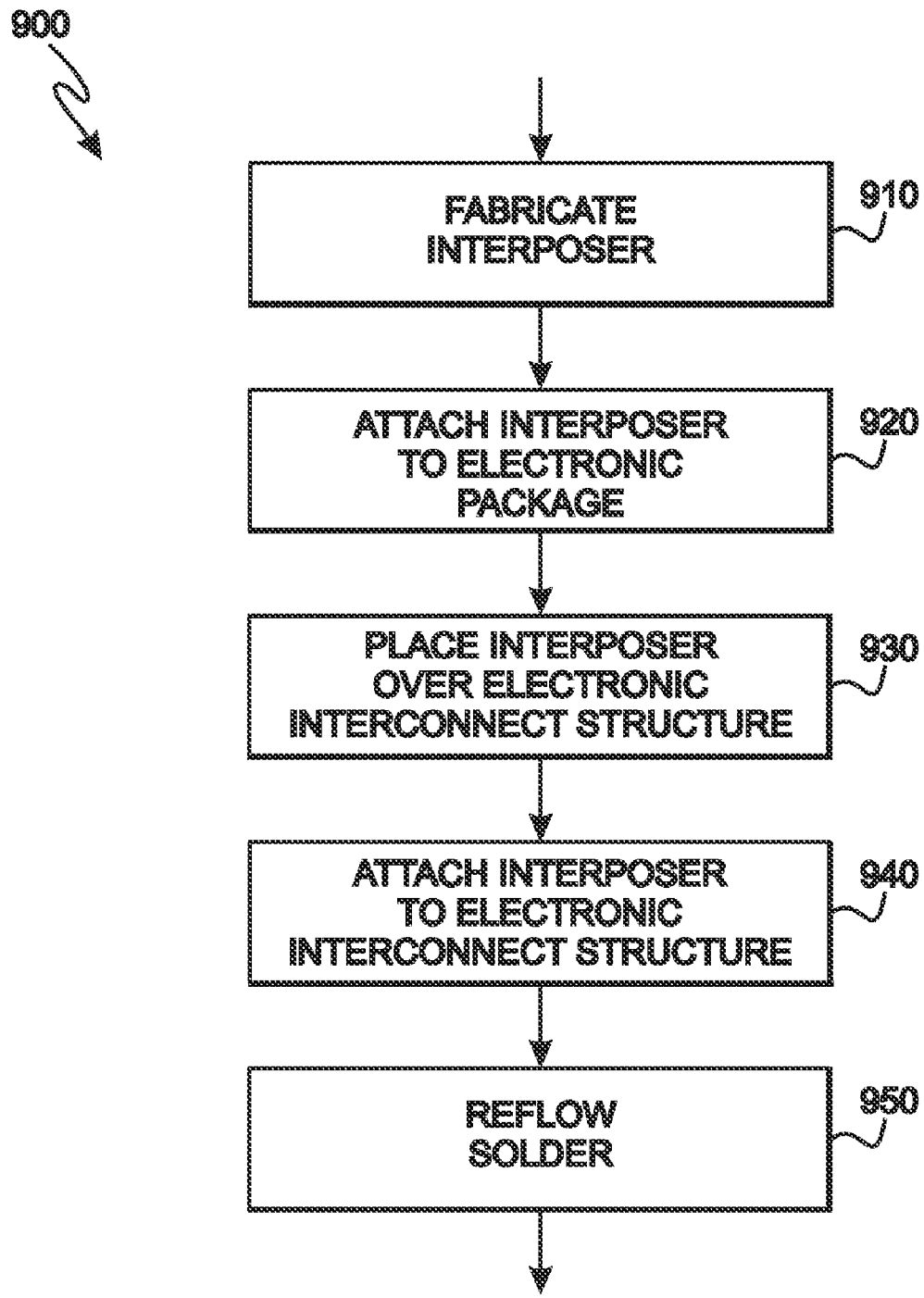
FIG. 9 is a flow chart of a method for constructing the assembly as described in various representative embodiments.

FIG. 9 is a flow chart of a method 900 for constructing the assembly 100 as described in various representative embodiments. In block 910 of FIG. 9, the interposer 110 is fabricated. Block 910 then transfers control to block 920.

In block 920, the interposer 110 is attached to the electronic package 200. Block 920 then transfers control to block 930.

In block 930, the interposer 110 is located over the electronic interconnect structure 315. Block 930 then transfers control to block 940.

In block 940, the interposer 110 is attached to the electronic interconnect structure 315. Block 940 then transfers control to block 950.

In block 950, the solder in the assembly 100 is reflowed. Block 950 then terminates the process.

Figure 10:
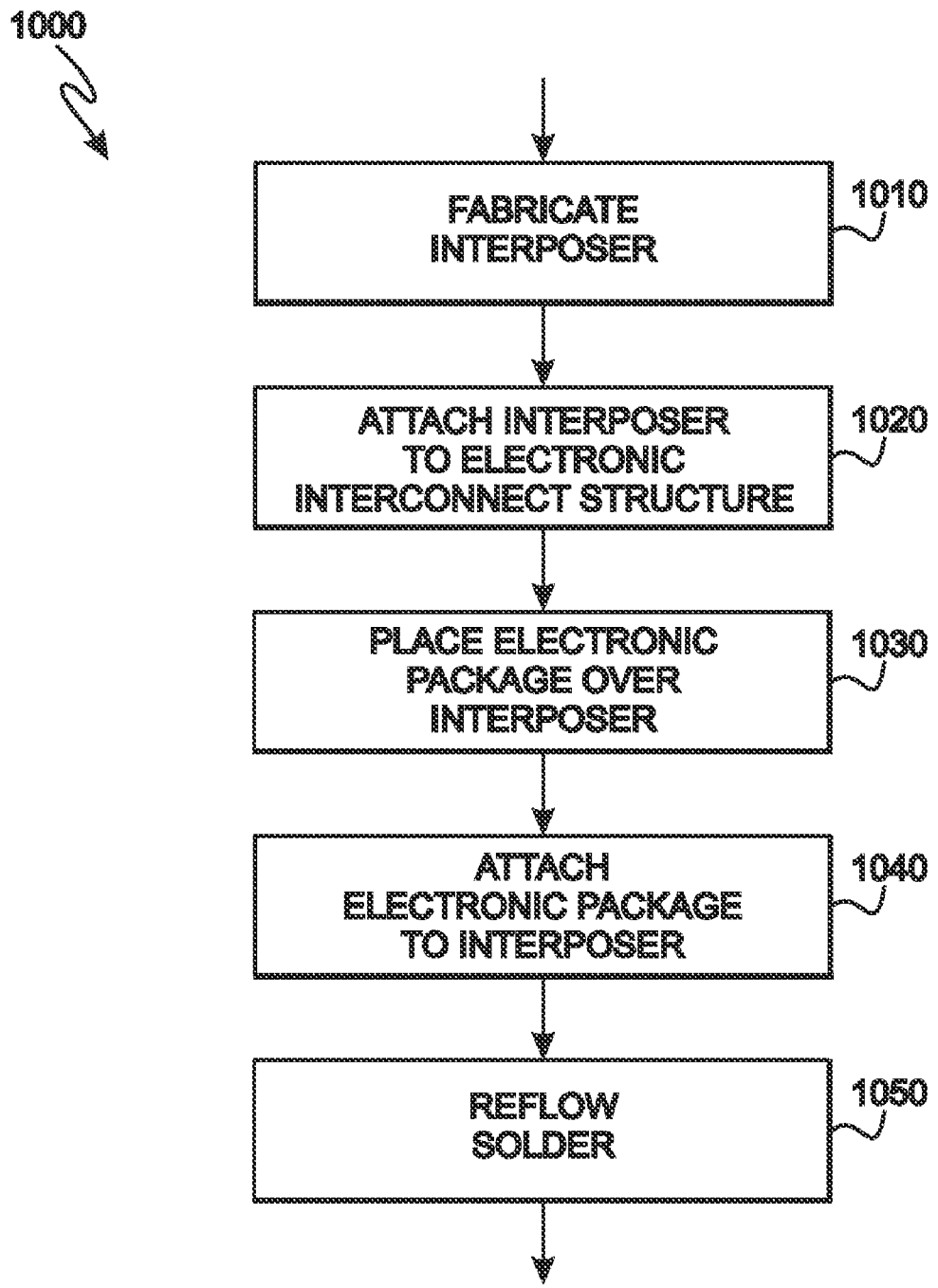
FIG. 10 is a flow chart of another method for constructing the assembly as described in various representative embodiments.

FIG. 10 is a flow chart of another method 1000 for constructing the assembly 100 as described in various representative embodiments. In block 1010 of FIG. 10, the interposer 110 is fabricated. Block 1010 then transfers control to block 1020.

In block 1020, the interposer 110 is attached to the electronic interconnect structure 315. Block 1020 then transfers control to block 1030.

In block 1030, the electronic package 200 is located over the interposer 110. Block 1030 then transfers control to block 1040.

In block 1040, the electronic package 200 is attached to the interposer 110. Block 1040 then transfers control to block 1050.

In block 1050, the solder in the assembly 100 is reflowed. Block 1050 then terminates the process.

The assembly 100 reduces damage to a related electronic package 200 during attachment to a related electronic interconnect structure 315. The assembly 100 comprises an interposer 110. The interposer 110 has a first side 230 and an opposing second side 240 and has multiple holes 120 formed in the interposer 110 that extend from the first side 230 to the second side 240. The electronic package 200 is configurable to comprise one or more electronic structures 220; the interposer 110 is configured for placement between the electronic package 200 and the electronic interconnect structure 315; the locus of a wall 250 of each of the holes 120 is configured to facilitate insertion of a matching coupling component 130 configured for electrically coupling the electronic package 200 to the electronic interconnect structure 315; the wall 250 of each hole 120 is configured to provide complete encirclement of that hole 120; and the interposer 110 mechanically inhibits physical contact between the electronic package 200 and the electronic interconnect structure 315.

A method 900,1000 for reducing damage to a related electronic package 200 during attachment to a related electronic interconnect structure 315 comprises fabricating an interposer 110 having a first side 230 and an opposing second side 240 and having multiple holes 120 formed in the interposer 110 extending from the first side 230 to the second side 240, placing the interposer 110 between the electronic package 200 and the electronic interconnect structure 315, and attaching the coupling components 130 to the electronic package 200 and the electronic interconnect structure 315. The electronic package 200 is configurable to comprise one or more electronic structures 220; the locus of a wall 250 of each of the holes 120 is configured to facilitate insertion of a matching coupling component 130 configured for electrically coupling the electronic package 200 to the electronic interconnect structure 315; and the wall 250 of each hole 120 is configured to provide complete encirclement of that hole 120. The interposer 110 mechanically inhibits physical contact between the electronic package 200 and the electronic interconnect structure 315.

The assembly 100 with the interposer 110 can distribute the load evenly across the full substrate 210 of the electronic package 200, reduce stress on the substrate 210 under a mechanical load, help prevent substrate 210 cracking (notably at the corners and edges), and reduce warp of the electronic package 200. By appropriate design and selection of materials, compensation for substrate 210 warp during a solder reflow process can help maintain the ball co-planarity. Due to more even load distributions under compression, the substrate 210 will experience less "bending" especially for lidless packages. For implementations with a clipped heatsink 305, the load applied due to the heatsink 305 is not directly applied on the printed circuit board 315 reducing, thereby, the heatsink 305 clip structure 335 as a source of printed circuit board 315 warp as the sandwiched interposer 110 provides added warp resistance. Further, the assembly 100 with the interposer 110 can make the electronic package 200 more resistant to shock and vibration, thereby maintaining the integrity of the assembly 100. The assembly 100 is more robust as the interposer 110 holes 120 protect the electronic component 220 and the delicate solder balls or columns during component placement. Due to the buffering of mechanical impact by the interposer 110, interface brittleness may be less likely to occur for lead free solder joints, as may other mechanically induced failure mechanisms, such as pad crater, trace cracking, and the like.

In addition, hardware design can be simplified and made flexible by designing in features such as the ability to clip-on a heatsink 305. For implementations requiring a heavy heatsink mass with associated bolster, the thickness of the bolster can be reduced or an open bolster can be used. Higher loads can be applied. A spacer stop can be designed in to provide support for the electronic component 220 and to reduce impact on the electronic component 220. A heatsink stop 340 can be included to prevent rocking of the heatsink 305 and to maintain the integrity of thermal interface. The load can be reduced on the solder balls by the interposer 110 and can maintain the height of the solder balls and columns. Reduced load and constant height can make the interconnect, especially solder column, less susceptible to buckling and creep. For other than conducting interposers 110, the interposer 110 electrically separates neighboring solder balls, thereby making them less susceptible to shorting during solder reflow. The interposer 110 can increase solder joint thermal fatigue life by applying an adhesive between the interposer 110 and the printed circuit board 315. The interposer 110 will then share thermally induced shear stress with the solder joints during temperature cycling conditions. Embedding metallic or other thermally conductive materials in the interposer 110 can facilitate heat dissipation. A sensor can be embedded in the interposer 110 to measure the center package temperature, as well as at other locations. The extent of solder ball leaning can be readily obtained by referencing the interposer 110 holes 120.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. An assembly for reducing damage to a related electronic package during attachment to a related electronic interconnect structure, comprising:

a heat sink and an electronic component;

an interposer having a first side and an opposing second side and having multiple holes formed in the interposer extending from the first side to the second side, wherein the interposer is configured for placement between the electronic package and the electronic interconnect structure, wherein locus of a wall of each of the holes is configured with a matching coupling component configured for electrically coupling the electronic package to the electronic interconnect structure, wherein the wall of each hole is configured to provide complete encirclement of that hole, and wherein the interposer mechanically inhibits physical contact between the electronic package and the electronic interconnect structure;

where the electronic component is mounted between the heat sink and the interposer and the heat sink is attached to the interposer.

2. The assembly as recited in claim 1, wherein fabrication material of the interposer is selected from the group consisting of a plastic, a thermoplastic, a plastic embedded with fibers, a polymer, a liquid crystal polymer, a metal, a metal having an outer dielectric layer, a metal coated with an outer dielectric layer, a metal having an outer plastic layer, a metal plate, a metal plate having an outer dielectric layer, a metal plate coated with an outer dielectric layer, a metal plate having an outer plastic layer, a ceramic, and a composite construct having a metal in a first region and a plastic in a second region.

3. The assembly as recited in claim 1, where the electronic package comprises:

a substrate;

where the electronic component is attached to a first side of the substrate; and conductors extending from a second side of the substrate;

wherein the interposer is attached to the second side of the substrate and where the conductors are aligned with and extend into the holes formed in the interposer, where the coupling component within a hole is connected to a conductor; and the electronic interconnect structure being connected to the interposer on an opposite side from the substrate, where the electronic interconnect structure includes interconnect traces electrically coupled to the coupling components within the holes of the interposer;

where the electronic component and the substrate are between the heat sink and the interposer.

4. The assembly as recited in claim 3, wherein the electronic package is selected from the group consisting of a ball grid array, a plastic ball grid array, a column grid array, a chip scale package, and a ceramic package.

5. The assembly as recited in claim 1, wherein the interposer is attached to the electronic interconnect structure.

6. The assembly as recited in claim 5, wherein the electronic interconnect structure is selected from the group consisting of a printed circuit board, an organic-based printed circuit board, a thick-film ceramic substrate, a cofired ceramic substrate, and a thin-film multilayer substrate.

7. The assembly as recited in claim 1, wherein at least one of the matching coupling components is selected from the group consisting of a solder ball and a solder column.

8. The assembly as recited in claim 1, wherein the interposer has at least one cut-out internal to a perimeter of the interposer.

9. The assembly as recited in claim 1, wherein the interposer has one formed hole for each coupling component configured for coupling between the related electronic package and the related electronic interconnect structure.

10. The assembly as recited in claim 1, wherein the interposer further comprises at least one alignment pin.

11. The assembly as recited in claim 1, wherein the interposer further comprises an alignment frame configured for aligning the electronic package to the interposer.

12. The assembly as recited in claim 1, wherein the interposer further comprises a clip latch attachment surface.

13. The assembly as recited in claim 1, wherein at least one coupling component is placed in at least one hole and at least partially fills that hole.

14. The assembly as recited in claim 13, wherein the at least one coupling component is selected from the group consisting of a solder ball and a solder column.

15. The assembly as recited in claim 1, wherein the interposer further comprises a heatsink stop configured for restricting force applied to the electronic package from a heatsink attachment to the electronic package.

16. An electronic package assembly comprising:
a heat sink:
a substrate having a first side and an opposing second side;
an electronic component attached to the first side of the substrate between the substrate and the heat sink;
conductors extending from the second side of the substrate;
an interposer is attached to the second side of the substrate, where the interposer comprises holes formed therethrough and a coupling component positioned within the holes;
where the heat sink is attached to the interposer with an attachment device;
the conductors of the substrate being aligned with and extending into the holes formed in the interposer, where the coupling components within the holes are connected to corresponding conductors; and
an electronic interconnect structure connected to the interposer on an opposite side from the substrate, where the electronic interconnect includes interconnect traces electrically coupled to the coupling components within the holes of the interposer.

* * * * *

UNITED STATES PATENT AND TRADEMARK OFFICE
CERTIFICATE OF CORRECTION

PATENT NO. : 7,742,311 B2
APPLICATION NO. : 11/735067
DATED : June 22, 2010
INVENTOR(S) : Weifeng Liu It is certified that error appears in the above-identified patent and that said Letters Patent is hereby corrected as shown below:

In column 11, line 14, in Claim 16, delete "sink:" and insert -- sink; --, therefor.

Signed and Sealed this

Twelfth Day of October, 2010

David J. Kappos
*Director of the United States Patent and Trademark Office*